United States Patent [19]

Inokuchi

[11] 4,061,992

[45] Dec. 6, 1977

[54] HELICAL RESONATOR FILTER

[75] Inventor: Takahiro Inokuchi, Sakado, Japan

[73] Assignee: Toko, Inc., Tokyo, Japan

[21] Appl. No.: 604,885

[22] Filed: Aug. 14, 1975

[30] Foreign Application Priority Data

Aug. 21, 1974 Japan .................................. 49-95978

[51] Int. Cl.[2] .......................... H01P 5/04; H01P 7/06; H03H 7/10

[52] U.S. Cl. .............................. 333/73 R; 333/73 W; 333/82 R

[58] Field of Search ................ 333/73 R, 73 W, 70 S, 333/82 R, 82 B, 83 R

[56] References Cited

U.S. PATENT DOCUMENTS

| | | | |
|---|---|---|---|
| 2,517,741 | 8/1950 | Varone | 333/78 X |
| 3,691,487 | 9/1972 | Yoshimoto | 333/73 R |
| 3,763,447 | 10/1973 | Takahashi et al. | 333/73 R |
| 3,820,045 | 6/1974 | Igarashi | 333/70 S |
| 3,836,881 | 9/1974 | Koizumi | 333/73 R X |
| 3,895,325 | 7/1975 | Fischer et al. | 333/70 S |

OTHER PUBLICATIONS

Rogers — "The Theory of Networks in Electrical Communication and Other Fields", MacDonald, London, 1957; Title Page & pp. 77–79.

*Primary Examiner*—Alfred E. Smith
*Assistant Examiner*—Marvin Nussbaum
*Attorney, Agent, or Firm*—Bacon & Thomas

[57] ABSTRACT

A helical resonator filter is disclosed which comprises helical coils wound on hollow bobbins respectively, and magnetic cores adjustably inserted in the hollow bobbins respectively, the helical coils being electromagnetically coupled to each other via the magnetic cores. The hollow bobbins are accommodated in a metal casing which is provided with no inside partition wall formed with a window adapted for enabling the coils to be electromagnetically coupled to each other. Thus, the characteristic of the helical resonator filter can be controlled as desired, simply by adjusting the length of that portion of each magnetic core which is inserted in or overlapped by each helical coil.

1 Claim, 6 Drawing Figures

HELICAL RESONATOR FILTER

BACKGROUND OF THE INVENTION

1. Field of the Invention

This invention relates to a helical resonator filter accommodated within a metal casing, and more particularly it pertains to such a filter which is arranged to provide a desired characteristic without providing any partition wall formed with a window inside the casing thereof.

2. Description of the Prior Art

In prior art, it has been the practice that use is made of a metal casing provided with inside partition walls, each of which is formed with a window, to define compartments in which helical coils each wound on a hollow bobbin are disposed in such a manner as to be electromagnetically coupled to each other through the aforementioned windows, and that the size of each of the windows is so selected as to make the coupling coefficients suitable for achieving a desired characteristic. With such prior arrangement, however, cumbersome working operation is involved in providing partition walls such as mentioned above in the casing. Furthermore, the sizes of the windows must be changed to achieve different characteristics. Thus, the manufacturing cost of the filter is inevitably increased.

SUMMARY OF THE INVENTION

Accordingly, it is a primary object of this invention to make it possible to adjustably establish desired couplings between respective helical coils constituting a helical resonator filter, without providing such partition walls as mentioned above inside the casing.

Another object of this invention is to provide a helical resonator filter which is arranged so that the couplings between respective helical coils can be adjusted so as to provide for a desired characteristic, simply by adjusting magnetic cores which are adjustably inserted in hollow bobbins having the helical coils wound thereon respectively.

Other objects, features and advantages of this invention will become apparent from the following description taken in conjunction with the accompanying drawings.

DESCRIPTION OF THE PREFERRED EMBODIMENTS

Figure 1:
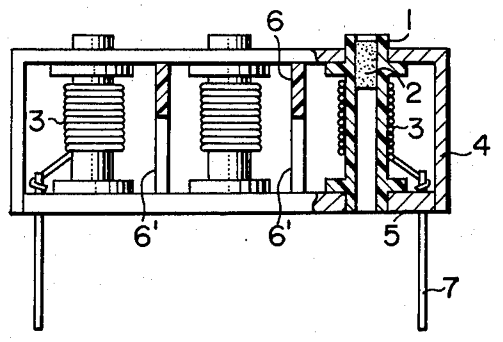
FIG. 1 PRIOR ART
FIG. 1 is an elevational side view partly in section of a conventional helical resonator filter.

In order to give better understanding of this invention, description will first be made of a conventional helical resonator filter with reference to FIG. 1, wherein a plurality of hollow bobbins 1 having helical coils 3 wound thereon respectively are arranged on a base plate 5 in predetermined spaced relationship with each other and with the axes thereof disposed substantially perpendicularly with respect to the upper surface of the base plate 5. In each of the hollow bobbins is inserted a magnetic core 2 which serves to determine the center frequency of the filter. The bobbins 1 are accommodated in a metal casing 4. As will be apparent from the drawing, the metal casing 4 is provided with partition walls 6 formed with windows 6' respectively through which the respective helical coils 3 are electromagnetically coupled to each other. The partition walls 6 define compartments in which the helical coils 3 are disposed, respectively. In the base plate is planted terminal pins 7 to which the ends of the helical coils are connected in a usual manner.

With the foregoing prior-art arrangement, the coupling coefficients between the respective helical coils depend upon the sizes of the windows. Conversely, the sizes of the windows must be changed in order to achieve a different characteristic. In other words, it is necessary to provide partition walls with windows having different sizes to provide for different characteristics. This is disadvantageous in that the manufacturing cost becomes higher, as mentioned earlier.

Figure 2:
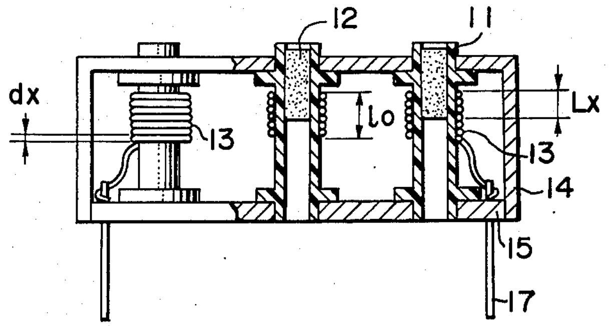
FIG. 2 is an elevational side view partly in section of the helical resonator filter according to an embodiment of this invention.

Referring now to FIG. 2, there is illustrated the helical resonator filter according to an embodiment of this invention. Hollow bobbins 11 are arranged in a row on a base plate 15 in predetermined spaced relationship with each other and with the axes thereof disposed substantially perpendicularly with respect to the upper surface of the base plate. On the hollow bobbins 11 are wound helical coils 13 over a width of $l_0$, each of the helical coils being formed of a wire-like member having a diameter of $dx$. Magnetic cores 12 are adjustably inserted in the hollow bobbins 11 in such a manner that the magnetic cores 12 and helical coils 13 overlap each other over a length of $L_x$ as will be seen from FIG. 2. Thus, in FIG. 2, the reference $l_0$ indicates the winding width of each helical coil 13, and the reference $L_x$ represents the length of that portion of each magnetic core 12 which is inserted in or overlapped by each helical coil 13. It is to be particularly noted that the hollow bobbins 11 are accommodated in a metal casing 14 which has no partition walls such as those provided in the prior-art arrangement mentioned above. The casing 14 has a substantially uniform cross-sectional shape over the entire longitudinal length thereof, since it is provided with no such partition walls as those of the prior-art casing.

Figure 3A:
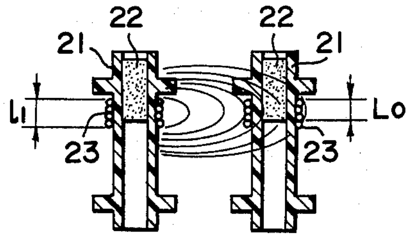
FIGS. 3A, 3B, 4A, and 4B are sectional side views useful for illustrating the principles of this invention, respectively.
Figure 3B:
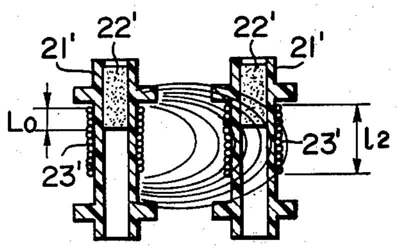

The principles of the present invention will be described with reference to FIG. 3. FIG. 3A shows the case where there are arranged two hollow bobbins 21 each of which has a helical coil 23 wound thereon over a width of $l_1$ and a magnetic core 22 inserted therein in such a manner that the magnetic core 22 and helical coil 23 overlap each other over a length of $L_0$, and FIG. 3B shows the case where there are arranged two hollow bobbins 21' each of which has a helical coil 23' wound thereon over a length of $l_2$ which is greater than $l_1$ and a magnetic core 22' inserted therein in such a manner that the magnetic core 22' and helical coil 23' overlap each other over a length of $L_0$. In this case, the number of interlinking magnetic fluxes between the helical coils 23 whose winding width is $l_1$ as shown in FIG. 3A is less than that between the helical coils 23' whose winding width is $l_2$ greater than $l_1$ as shown in FIG. 3B. This is because the number of interlinking magnetic fluxes is proportional to the winding width of each helical coil. Thus, the coupling coefficient $k_1$ between the helical coils 23 whose winding width $l_1$ is smaller than the coupling coefficient $k_2$ between the helical coils 23' whose winding width is $l_2$ which is greater than $l_1$. In other words, the coupling coefficient between the helical coils is determined from the winding width of each coil.

Figure 4A:
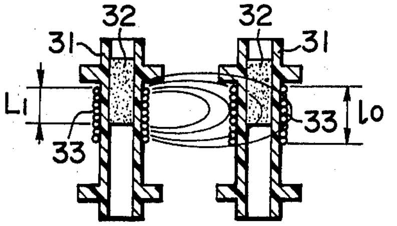
Figure 4B:
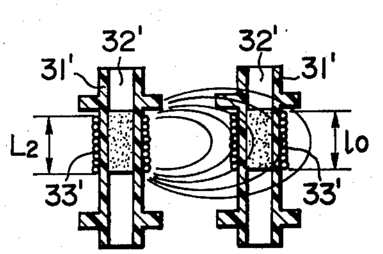

The principles of this invention will now be described with respect to the case where as shown in FIG. 4, the winding widths of helical coils 33 and 33' wound on hollow bobbins 31 and 31' are made to be equal to each other as indicated by $l_0$, and the length $L_1$ of that portion of each magnetic core 32 which is inserted in or surrounded by each helical coil 33 is made to be different from the length $L_2$ of that portion of each magnetic core 32' which is inserted in or surrounded by each helical coil 33'. FIG. 4A shows the case where each of the helical coils 33 has a winding width of $l_0$ and the length of that portion of each magnetic core 32 which is overlapped by each of the helical coils 33 is $L_1$, and FIG. 4B indicates the case where each of the helical coils 33' has a winding width $l_0$ equal to that of the coils 33 and the length of that portion of each core 32' which is overlapped by each helical coil 33' is $L_2$. The length $L_1$ is made to be smaller than the length $L_2$ ($L_1 < L_2$). Thus, the number of interlinking magnetic fluxes is greater in the case of $L_2$ than in the case of $L_1$; accordingly, the coupling coefficient $k$ between the helical coils is higher in the former case than in the latter case. This will readily be appreciated from a comparison of FIGS. 4A and 4B.

Referring again to FIG. 2, the winding width $l_x$ of each helical coil 13, diameter $dx$ of the wire constituting each coil and the number of turns $n$ of each coil can be determined as follows:

Assume that the desired center frequency of the helical resonator filter is $f_0$. Then the length of the wire constituting each helical coil 13 can readily be determined by virtue of the fact that the helical resonator filter is employed at a resonance frequency corresponding to one-fourth of the wavelength. The circumferential length of each hollow bobbin 11 is also readily known since the bobbin is specified. Thus, the number of turns $n$ of each coil 13 can be determined simply by dividing the length of the wire constituting each coil by the circumferential length of each hollow bobbin 11. The winding width $l_x$ of each coil can be determined from the circumferential length of each hollow bobbin 11 and center frequency $f_0$ or from the desired coupling coefficient $k$. Finally, the diameter $dx$ of the wire constituting each helical coil 13 can be determined by dividing the winding width $l_x$ by the number of turns $n$.

As described above in connection with FIG. 4, in the helical resonator filter according to this invention, the coupling coefficient $k$ between the respective helical coils 13 is determined from the length $L_x$ of that portion of each magnetic core 12 which is inserted in or overlapped by each helical coil 13. That is, the coupling coefficient $k$ is varied by changing the aforementioned length $L_x$ and coil wire diameter $dx$ individually or all together. This can be represented by the following expression:

$$k \propto P \cdot F(L_x, dx) \quad (1)$$

where $P$ is a constant. Thus, with the helical resonator filter according to this invention, it is possible to achieve any desired coupling coefficient by determining the length $L_x$ of that portion of each magnetic core 12 which is inserted in or overlapped by the helical coil 13, and the diameter $dx$ of the coil wire, in accordance with the foregoing expression (1).

Table 1 illustrates examples of actual designs of the present helical resonator filter, wherein use is made of hollow bobbins 13 each having a diameter 4.7mm and metal casings 14 of identical size and configuration. It goes without saying that none of the metal casings includes any inside partition wall 6 formed with the window 6' such as provided in the prior-art arrangement described above in connection with FIG. 1.

Table 1

| Items \ Examples $f_0$ | Example 1 37 MHz | Example 2 45 MHz | Example 3 57 MHz |
|---|---|---|---|
| dx (mm) | 0.06 | 0.07 | 0.08 |
| $L_x$ (mm) | 8 | 8 | 6 |
| n (turns) | 90 | 80 | 70 |
| 6 dB bandwidth | 4.7 MHz | 4.7 MHz | 4.7 MHz |

As will be appreciated from what has been described above, in accordance with the present invention, it is possible to determine the coupling coefficient between the respective helical coils simply by suitably selecting the length of that portion of each magnetic core which is inserted in or overlapped by each helical coil and the diameter of the wire constituting the helical coils; thus, a helical resonator filter with a desired characteristic can be produced without using a metal casing which is provided with inside partition walls each formed with a window for controlling the coupling coefficient as is the case with prior art. In addition, according to this invention, a high freedom of design can be secured. In this way, according to this invention, it is possible to provide a helical resonator filter having a desired center frequency of $f_0$ simply by seeking the aforementioned length $L_x$ and diameter $dx$ in accordance with the expression (1) mentioned above, on the assumption that the coupling coefficient $k$ between the respective helical coils, which corresponds to the desired center frequency, is known.

While a preferred embodiment of this invention has been described in detail, it will be obvious to those skilled in the art that the invention may be embodied otherwise without departing from its spirit and scope.

What is claimed is:

1. A helical resonator filter including hollow bobbins arranged on a base plate in predetermined spaced relationship with each other, helical resonators comprising helical coils each constituted by a wire-like member wound on said hollow bobbins respectively, said helical resonators being directly coupled without obstruction, magnetic cores adjustably inserted in said hollow bobbins, the improvement comprising means for adjusting the length of that portion of each helical coil which overlaps each associated magnetic core axially of said each helical coil, said means being arranged to provide the following relationship:

$$k \propto P \cdot F(L_x, dx)$$

where $k$ is the coupling coefficient between the respective helical coils, $dx$ is the diameter of said wire-like member constituting each of said helical coils, $L_x$ is the length of that portion of each magnetic core which is inserted in or overlapped by each helical coil, and $P$ is a constant, whereby desired elctromagnetic coupling can be adjustably established between the respective helical coils via said magnetic cores.

* * * * *